United States Patent
Mizuguchi et al.

(10) Patent No.: US 7,072,026 B2
(45) Date of Patent: Jul. 4, 2006

(54) EXPOSURE APPARATUS AND OPTICAL COMPONENT FOR THE SAME

(75) Inventors: Masafumi Mizuguchi, Yokohama (JP); Norio Komine, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/202,086

(22) Filed: Aug. 12, 2005

(65) Prior Publication Data

US 2006/0012768 A1    Jan. 19, 2006

Related U.S. Application Data

(63) Continuation of application No. PCT/JP04/01630, filed on Feb. 16, 2004.

(30) Foreign Application Priority Data

Feb. 17, 2003    (JP)    ............................. 2003-038345

(51) Int. Cl.
*G03B 27/72*    (2006.01)
*G03B 27/42*    (2006.01)

(52) U.S. Cl. .......................................... 355/69; 355/53

(58) Field of Classification Search .................. 355/53, 355/55, 67–71; 501/53, 54; 65/17.3, 17.6
See application file for complete search history.

(56) References Cited

U.S. PATENT DOCUMENTS 6,143,676 A * 11/2000 Ohashi et al. ................. 501/54

| | | | |
|---|---|---|---|
| 6,189,339 B1 | 2/2001 | Hiraiwa | |
| 6,252,662 B1 | 6/2001 | Sugita | |
| 6,320,661 B1 * | 11/2001 | Yoshida et al. | 356/432 |
| 6,473,227 B1 * | 10/2002 | Yamagata | 359/361 |
| 6,587,181 B1 * | 7/2003 | Jinbo et al. | 355/67 |
| 2001/0055103 A1 | 12/2001 | Nishi | |

FOREIGN PATENT DOCUMENTS

| EP | 1 084 995 A1 | 3/2001 |
|---|---|---|
| JP | A 8-262201 | 10/1996 |
| JP | A 10-279321 | 10/1996 |
| JP | A 11-224851 | 8/1999 |
| JP | A 2000-239040 | 9/2000 |
| JP | WO 01/03170 A1 | 1/2001 |
| JP | A 2001-89170 | 4/2001 |
| JP | A 2002-33272 | 1/2002 |
| WO | WO 01/20651 A1 | 2/2001 |

* cited by examiner

*Primary Examiner*—Henry Hung Nguyen
(74) *Attorney, Agent, or Firm*—Oliff & Berridge PLC

(57) ABSTRACT

In an exposure apparatus, an exposure object is exposed to light by applying pulsed light that has a wavelength of 300 nm or less and that has been passed through a plurality of optical components. At least one of the plurality of optical components is made of a synthetic silica glass component. The thickness of the synthetic silica glass component, and the energy density per pulse and the pulse width of the pulsed light satisfy the following expression:

$$\tau I^{-2} L^{-1.7} \geq 0.02 \; (\text{ns} \cdot \text{mJ}^{-2} \cdot \text{cm}^{2.3} \cdot \text{pulse}^{2})$$

wherein L is the thickness (unit: cm) of the synthetic silica glass component, I is the energy density (unit: mJ·cm$^{-2}$·pulse$^{-1}$) per pulse, and $\tau$ is the pulse width (unit: ns).

11 Claims, 4 Drawing Sheets

EXPOSURE APPARATUS AND OPTICAL COMPONENT FOR THE SAME

This is a Continuation of Application No. PCT/JP2004/001630 filed Feb. 16, 2004, which claims the benefit of U.S. Provisional Application No. JP 2003-038345 filed Feb. 17, 2003. The entire disclosure of the prior application is hereby incorporated by reference herein in its entirety.

TECHNICAL FIELD

The present invention relates to an optical component such as a lens or a mirror used in a specific waveband at or below 300 nm in excimer laser lithography technology, and to an exposure apparatus using the same.

BACKGROUND ART

For the transfer of patterns of integrated circuits such as ICs and LSIs, a reduction projection aligner or a photolithography apparatus is mainly used. With the enhancement of integration degrees of integrated circuits, a wide exposure area and a high resolution over the entire exposure area are required for a projection optical system used in such an apparatus. In order to further improve the resolution of the projection optical system, it can be considered to further reduce the exposure wavelength or increase the numerical aperture (NA) of the projection optical system. At present, KrF (248 nm) excimer lasers are mainly used as light sources of exposure apparatuses. In order to further improve the resolution, KrF excimer lasers, which are deep ultraviolet rays having shorter wavelength, have been developed.

With knowledge in known excimer laser lithography technology, damages of optical components are mostly classified broadly into three types. The first type is a reduction in internal transmittance caused by the generation of internal defects (see Japanese Patent Application Laid-Open Gazette No. Hei 8-259255). The second type is a refractive index change associated with a volume change such as compaction or expansion (see International Application National-Phase Publication No. 2000-517284). The third type is a surface state change such as the destruction or contamination of an optical thin film (see Japanese Patent Application Laid-Open Gazette Nos. 2002-14202 and Hei 11-52102).

However, damage which does not belong to any of them has been recently reported and attracted interest (see E. M. Wright et al., "Spatial pattern microchannel formation in silica glass irradiated by nanosecond ultraviolet pulses", Applied Optics, 1999, Vol. 38, p. 5785–5788). This is the microchannel phenomenon in which holes having diameters of several µm are formed from a surface of an optical component to the inside thereof. It is expected that the occurrence of this phenomenon causes a reduction in the transmittance of the optical component resulting from scattering and the destruction of an optical thin film, and significantly reduces transmittance characteristics of the optical component.

However, there are few reports on the microchannel phenomenon, and sufficient knowledge has not been obtained yet. It has been known that this microchannel phenomenon has the following characteristics:

(1) It occurs when $10^9$ pulses of an ArF excimer laser having an energy density of several $mJ \cdot cm^{-2} \cdot pulse^{-1}$ are continued to be applied to synthetic silica glass.

(2) It occurs not at a face from which the laser is incident but at a back face.

(3) It occurs in the vicinity of the boundary between a portion irradiated with the laser and a non-irradiated portion.

This microchannel phenomenon occurs due to extremely long continuous irradiation homogeneous at low energy densities in a practical range under normal use conditions of an exposure apparatus. Accordingly, it is necessary to take prevention measures against mechanical damage resulting from this phenomenon.

DISCLOSURE OF THE INVENTION

The occurrence of this microchannel phenomenon causes a significant reduction in transmittance characteristics of an optical component, and also causes the occurrence of unnecessary scattering light. Thus, it is expected that the image-forming performance, stability, and life of an exposure apparatus deteriorate. Nevertheless, the cause of the generation of microchannels is not clear, and prevention measures against it have not been known. Accordingly, an object of the present invention is to provide an optical component and an exposure apparatus in which the generation of microchannels can be reduced.

The occurrence of this microchannel phenomenon causes a significant reduction in transmittance characteristics of an optical component, and also causes the occurrence of unnecessary scattering light. Thus, it is expected that the image-forming performance, stability, and life of an exposure apparatus deteriorate. Nevertheless, the cause of the generation of microchannels is not clear, and prevention measures against it have not been known. Accordingly, an object of the present invention is to provide an optical component and an exposure apparatus in which the generation of microchannels can be reduced.

The present inventors investigated generation conditions by actually generating microchannels by applying KrF or ArF excimer laser light, which is pulsed light, to each of various kinds of optical components made of synthetic silica glass, a quartz single crystal, a calcium fluoride single crystal, and the like.

As a result, this led to the idea that the cause of the generation of microchannels is self-focusing resulting from a refractive index change, which is a characteristic phenomenon of synthetic silica. That is, when synthetic silica glass is irradiated with the laser light, a refractive index change accompanied by compaction occurs. While this irradiation is repeated, a small amount of a refractive index change is accumulated to remain as a greatly-varied refractive index distribution in the optical component. Thus, light is bent toward a portion having a higher refractive index, and the irradiation light is gradually self-focused near the back face of the optical component. Then, at last, the energy density of the irradiation light becomes as high as it exceeds the destruction threshold of the optical component near the back face.

FIG. 1 is a graph showing the relationship between the energy density I per pulse and the number N of pulses necessary for the generation of microchannels in the irradiation or a synthetic silica glass sample with excimer laser light.

The sample used in the irradiation experiment was prepared by cutting synthetic silica glass containing 1100 ppm OH groups and $2 \times 10^{18}$ hydrogen molecules/$cm^3$ to a size having a diameter of 30 mm and a thickness of 10 mm, and by optically polishing both faces having diameters of 30 mm. KrF excimer laser light or ArF excimer laser light which is limited by an aperture and which has a diameter of 5 mm was directly applied to the sample from a light source without being passed through an optical component such as a lens or a homogenizer. The energy density per pulse of the laser light was adjusted by changing the discharge voltage, and the value was measured by placing a Joule meter at the position of the sample. The sample was placed inside a box made of aluminum, and the atmosphere in the box was replaced with dry nitrogen gas. The energy density of the laser light was fixed, and predetermined pulses of the laser light were applied. The pulse width $\tau$ of the laser light is 20 ns in both the cases of KrF and ArF excimer lasers. The presence or absence of microchannels was confirmed by visual inspection by irradiating the sample with the light of a condenser lamp.

In FIG. 1, the straight line $K_{10}$ indicates a correlation relating to KrF excimer laser light, and the straight line $A_{10}$ indicates a correlation relating to ArF excimer laser light. These straight lines indicate thresholds at which microchannels are generated. No microchannels were generated in the region on the left side from the straight lines $K_{10}$ and $A_{10}$.

From the result of the above-described experiment, it was clarified that microchannels are more prone to be generated as the energy density I per pulse of applied pulsed light increases. Further, it was revealed that the number N of pulses necessary for the generation of microchannels has a correlation with the energy density I per pulse and varies in inverse proportion to I squared.

Incidentally, microchannels relate to a refractive index change $\Delta n$ of synthetic silica glass. In this experiment, microchannels were generated when $\Delta n$ is 20 ppm in the case of KrF excimer laser light, and when $\Delta n$ is 2 ppm in the case of ArF excimer laser light.

Next, using a sample having a thickness of 100 mm, KrF excimer laser light was similarly applied thereto to find a threshold at which microchannels are generated. The result is shown as the straight line $K_{100}$ in FIG. 1.

From a comparison between $K_{10}$ and $K_{100}$, it was considered that a threshold at which microchannels are generated has a correlation with the thickness of a sample. Accordingly, in order to investigate the dependence thereof, the following experiment was performed.

A plurality of cuboids having 15 mm by 15 mm squares and thicknesses changed in the range of 30 mm to 100 mm were cut out from synthetic silica glass containing 1100 ppm OH groups and $2\times10^{18}$ hydrogen molecules/cm$^3$, and formed into samples by optically polishing both faces which are 15 mm by 15 mm squares. These samples were irradiated with ArF excimer laser light having an energy density of 20 mJ·cm$^{-2}$·pulse$^{-1}$, and thresholds at which microchannels are generated were found. The result is shown in FIG. 2.

The result of the experiment, it was clarified that microchannels are more prone to be generated as the thickness of an optical component increases, and it was revealed that the number N of pulses necessary for the generation of microchannels varies in inverse proportion to the thickness L raised to the 1.7 power.

From the results of the above-described experiments and a report (see Applied Optics, 1999, Vol. 38, p. 5785–5788) to the effect that $\Delta n$ resulting from compaction varies in inverse proportion to a pulse width $\tau$, the present inventors succeeded in deriving an expression representing the interrelationship among the thickness L (cm) of an optical component, the energy density I (mJ·cm$^{-2}$·pulse$^{-1}$) per pulse of applied pulsed light, the pulse width $\tau$ (ns) of the pulsed light, and the number N (pulses) of pulses necessary for the generation of microchannels. That is, it was clarified that the following relationship is satisfied for KrF laser light:

$$N=5\times10^{11}\times\tau I^{-2}L^{-1.7}$$

and that the following relationship is satisfied for ArF laser light:

$$N=4\times10^{8}\times\tau I^{-2}L^{-1.7}$$

When an investigation is made on actual exposure apparatuses on which synthetic silica glass components are mounted, even if some of components into which light rays having extremely high energy densities enter are assumed to be regularly changed, it is desirable that no microchannels are generated in irradiation of at least $10^{10}$ pulses or more, more preferably $10^{11}$ pulses or more, in consideration of general operating states and useful lives in semiconductor factories. Accordingly, a relational expression for specifying a favorable range of the thickness of an optical component of the exposure apparatus can be derived by substituting $10^{10}$ pulses to N of any one of the above-described relational expressions.

That is, in the case of an optical component used for pulsed light having a wavelength of 300 nm or less, including KrF laser light, $10^{10}$ pulses of pulsed light can be applied without generating microchannels if the following is satisfied:

$$\tau I^{-2}L^{-1.7}\geq 0.02(\text{ns·mJ}^{-2}\cdot\text{cm}^{2.3}\cdot\text{pulse}^{2})$$

Meanwhile, in the case of an optical component used for pulsed light having a wavelength of 200 nm or less, including ArF laser light, $10^{10}$ pulses of pulsed light can be applied without generating microchannels if the following is satisfied:

$$\tau I^{-2}L^{-1.7}\geq 25(\text{ns·mJ}^{-2}\cdot\text{cm}^{2.3}\cdot\text{pulse}^{2})$$

Based on the above-described experiments and discussions, the present invention provides the following exposure apparatuses as means for reducing the generation of microchannels:

<1> An exposure apparatus which includes a light source emitting pulsed light having a wavelength of 300 nm or less and which exposes an exposure object to light by applying the pulsed light passed through a plurality of optical components, wherein at least one of the plurality of optical components is a synthetic silica glass component; and a thickness of the synthetic silica glass component, an energy density per pulse of pulsed light applied to the synthetic silica glass component, and a pulse width of the pulsed light satisfy the following expression (1);

$$\tau I^{-2}L^{-1.7}\geq 0.02(\text{ns·mJ}^{-2}\cdot\text{cm}^{2.3}\cdot\text{pulse}^{2}) \quad (1)$$

(In expression (1), L is the thickness (unit: cm) of the synthetic silica glass component, I is the energy density (unit: mJ·cm$^{-2}$·pulse$^{-1}$) per pulse of the pulsed light applied to the synthetic silica glass component, and $\tau$ is the pulse width (unit: ns) of the pulsed light.)

<2> The exposure apparatus wherein, in addition to the constitution described in <1>, the wavelength of the pulsed light is 200 nm or less; and the thickness of the synthetic silica glass component, the energy density per pulse of the pulsed light applied to the synthetic silica glass component, and the pulse width of the pulsed light satisfy the following expression (2):

$$\tau I^{-2}L^{-1.7}\geq 25(\text{ns·mJ}^{-2}\cdot\text{cm}^{2.3}\cdot\text{pulse}^{2}) \quad (2)$$

(In expression (2), L is the thickness (unit: cm) of the synthetic silica glass component, I is the energy density (unit: mJ·cm$^{-2}$·pulse$^{-1}$) per pulse of the pulsed light applied to the synthetic silica glass component, and τ is the pulse width (unit: ns) of the pulsed light.)

<3> The exposure apparatus described in <1>, wherein the number of synthetic silica glass components satisfying expression (1) is half or more of the total number of synthetic silica glass components among the plurality of optical components.

<4> The exposure apparatus described in <2>, wherein the number of synthetic silica glass components satisfying expression (2) is half or more of the total number of synthetic silica glass components among the plurality of optical components.

The present inventors subsequently studied the correlation between the microchannel phenomenon and the composition and various physical properties of an optical component, and come to make the following inventions as means for reducing the generation of microchannels:

<5> An exposure apparatus which includes a light source emitting pulsed light having a wavelength of 300 nm or less and which exposes an exposure object to light by applying the pulsed light passed through a plurality of optical components, wherein among the plurality of optical components, components to which pulsed light having an energy density of 1 mJ·cm$^{-2}$·pulse$^{-1}$ or more per pulse is applied are made of at least one selected from the group consisting of a quartz single crystal, an aluminum oxide single crystal, a calcium fluoride single crystal, a magnesium fluoride single crystal, and anhydrous silica glass doped with fluorine.

<6> The exposure apparatus wherein, in addition to the constitution described in <5>, an amount of a refractive index change of the anhydrous silica glass doped with fluorine, the amount being measured at a wavelength of 633 nm, is 3 ppm or less after application of 1×10$^7$ pulses of ArF excimer laser light having an energy density of 30 mJ·cm$^{-2}$·pulse$^{-1}$ or more per pulse.

<7> An exposure apparatus which includes a light source emitting ultraviolet light having a wavelength of 300 nm or less and which exposes an exposure object to light by applying the ultraviolet light passed through a plurality of optical components, wherein at least one of the plurality of optical components is a synthetic silica glass component, and optical components placed closer to the light source compared to the synthetic silica glass component are classified into any one of striae grades 1 to 3 in an evaluation according to Japanese Optical Glass Industrial Standards (JOGIS) 11-1975.

<7-1> The exposure apparatus described in <1>, wherein the light source emits pulsed ultraviolet light having a wavelength of 300 nm or less, at least one of the plurality of optical components is a synthetic silica glass component, and optical components placed closer to the light source compared to the synthetic silica glass component are classified into any one of striae grades 1 to 3 in an evaluation according to Japanese Optical Glass Industrial Standards (JOGIS) 11-1975.

<8> An exposure apparatus which includes a light source emitting ultraviolet light having a wavelength of 300 nm or less and which exposes an exposure object to light by applying the ultraviolet light passed through a plurality of optical components, wherein at least one of the plurality of optical components is a synthetic silica glass component, and sizes of foreign substances and bubbles contained in optical components placed closer to the light source than the synthetic silica glass component are 1 μm or less.

<8-1> The exposure apparatus described in <1>, wherein the light source emits pulsed ultraviolet light having a wavelength of 300 nm or less, at least one of the plurality of optical components is a synthetic silica glass component, and sizes of foreign substances and bubbles contained in optical components placed closer to the light source than the synthetic silica glass component are 1 μm or less.

Next, the present inventors also studied the relationship between the beam quality of pulsed light and microchannels and obtained the following knowledge.

FIG. 3 shows a schematic diagram of a differential interference contrast microscopy image of microchannels in a back face of a sample. In this drawing, the symbols * represent microchannels, and the signs m denote three grooves linearly extending. The grooves m were formed approximately parallel to each other, and the intervals therebetween were approximately 0.1 mm. Here, it was revealed that microchannels are generated in the vicinity of the boundary between an irradiated portion and a non-irradiated portion and along the grooves m having intervals of approximately 0.1 mm.

Meanwhile, an investigation of the beam profile of excimer laser light revealed that there is energy density inhomogeneity having a structure containing layers of approximately 0.1 mm and that a portion having a high energy density locally exists. A measurement of this energy density inhomogeneity showed that the difference between a top portion and a bottom portion of the inhomogeneity is approximately 5% of an average energy density.

Accordingly, it can be speculated that the grooves m having intervals of 0.1 mm in the back face of the sample are structures based on the energy density inhomogeneity which excimer laser light has. From the fact that microchannels are generated along these grooves m, the following can be speculated; the probability was indicated that the generation of microchannels is accelerated because, as shown in FIG. 3, there are extremely fine and sharp structures of energy density inhomogeneity.

Incidentally, places where microchannels are generated are places where the energy density is high. In particular, in the case of laser light having inhomogeneous energy density, they were generated homogeneous in the inside of a component in some cases.

Moreover, when energy density inhomogeneity was observed in a plurality of samples, it was confirmed that the generation of microchannels is easily reduced if the width between adjacent top portions of the energy density is 0.1 mm or more in the case of light in which the difference between a top portion and a bottom portion of energy density inhomogeneity is 5% or less of an average energy density.

Based on the results of the above-described study, the present inventors come to make the following inventions;

<9> An exposure apparatus which includes a light source emitting ultraviolet light having a wavelength of 300 nm or less and which exposes an exposure object to light by applying the ultraviolet light passed through a plurality of optical components, wherein at least one of the plurality of optical components is a synthetic silica glass component; and, in ultraviolet light applied to the synthetic silica glass component, a width between adjacent top portions of energy density inhomogeneity in a plane perpendicular to an optical axis is larger than 0.1 mm, and a difference between a top portion and a bottom portion of the energy density is 5% or less of an average energy density.

<9-1> The exposure apparatus described in <1>, wherein the light source emits pulsed ultraviolet light having a wavelength of 300 nm or less; at least one of the plurality of optical components is a synthetic silica glass component; and, in ultraviolet light applied to the synthetic silica glass component, a width between adjacent top portions of energy density inhomogeneity in a plane perpendicular to an optical axis is larger than 0.1 mm, and a difference between a top portion and a bottom portion of the energy density is 5% or less of an average energy density.

<10> An exposure apparatus which includes: a light source emitting ultraviolet light having a wavelength of 300 nm or less; and a homogenizer reducing energy density inhomogeneity of the ultraviolet light in a plane perpendicular to an optical axis, and which exposes an exposure object by applying the ultraviolet light passed through a plurality of optical components, wherein at least one of the plurality of optical components is a synthetic silica glass component, and all the synthetic silica glass component is placed closer to the exposure object than the homogenizer placed closest to the light source is.

<10-1> The exposure apparatus described in <1>, further including: a homogenizer reducing energy density inhomogeneity of the ultraviolet light in a plane perpendicular to an optical axis, wherein the light source emits pulsed ultraviolet light having a wavelength of 300 nm or less, at least one of the plurality of optical components is a synthetic silica glass component, and all the synthetic silica glass component is placed closer to the exposure object than the homogenizer placed closest to the light source is.

<11> A synthetic silica glass component for exposure apparatus used in an optical system of an exposure apparatus which exposes an exposure object to pulsed light having a wavelength of 300 nm or less, wherein a thickness of the synthetic silica glass component, an energy density per pulse of the pulsed light applied to the synthetic silica glass component, and a pulse width of the pulsed light satisfy the following expression (3):

$$\tau I^{-2} L^{-1.7} > 0.02 (\text{ns} \cdot \text{mJ}^{-2} \cdot \text{cm}^{2.3} \cdot \text{pulse}^2) \quad (3)$$

(In expression (3), L is the thickness (unit: cm) of the synthetic silica glass component, I is the energy density (unit: $mJ \cdot cm^{-2} \cdot pulse^{-1}$) per pulse of the pulsed light applied to the synthetic silica glass component, and $\tau$ is the pulse width (unit: ns) of the pulsed light.)

<12> The synthetic silica glass component for exposure apparatus wherein, in addition to the constitution described in <11>, the wavelength of the pulsed light is 200 nm or less; and the thickness of the synthetic silica glass component, the energy density per pulse of the pulsed light applied to the synthetic silica glass component, and the pulse width of the pulsed light satisfy the following expression (4):

$$\tau I^{-2} L^{-1.7} \geq 25 (\text{ns} \cdot \text{mJ}^{-2} \cdot \text{cm}^{2.3} \cdot \text{pulse}^2) \quad (4)$$

(In expression (4), L is the thickness (unit: cm) of the synthetic silica glass component, I is the energy density (unit: $mJ \cdot cm^{-2} \cdot pulse^{-1}$) per pulse of the pulsed light applied to the synthetic silica glass component, and $\tau$ is the pulse width (unit: ns) of the pulsed light.)

<13> A method of exposing an image of a pattern provided on a master to light and projecting the image onto a substrate having a photosensitive material, wherein the exposure apparatus described in any one of <1> to <10>, <7-1>, <8-1>, <9-1>, and <10-1> is used.

In each of the exposure apparatuses of the present invention which are described in <1> and <2>, the thickness of the synthetic silica glass component, and the pulse width and the energy density per pulse of the pulsed light applied to the synthetic silica glass component are defined as a specific function. Accordingly, the generation of microchannels at the time of ultraviolet light irradiation can be reduced in the face of the synthetic silica glass component which is closer to an exposure object. This can prevent mechanical damage of the synthetic silica glass component when the exposure object is exposed to light, and can improve the life of the exposure apparatus.

In each of the exposure apparatuses of the present invention which are described in <3> and <4>, the number of synthetic silica glass components described in <1> or <2> is half or more of the total number of synthetic silica glass components. Accordingly, the life of the exposure apparatus can be further improved.

In the exposure apparatus of the present invention which is described in <5>, a plurality of optical components to which ultraviolet light having an energy density of a predetermined quantity or more is applied are formed of a single crystal or anhydrous silica glass doped with fluorine, with which the generation of microchannels can be reduced. Accordingly, the generation of microchannels can be reduced, and the life of the exposure apparatus can be improved.

In particular, in the exposure apparatus of the present invention which is described in <6>, a plurality of optical components to which ultraviolet light having an energy density of a predetermined quantity or more is applied are formed of the anhydrous silica glass doped with fluorine in which the amount of a refractive index change measured at a wavelength of 633 nm is 3 ppm or less after the application of $1 \times 10^7$ pulses of ArF excimer laser light having an energy density of 30 $mJ \cdot cm^{-2} \cdot pulse^{-1}$ per pulse. Accordingly, the generation of microchannels can be reduced, and the life of the exposure apparatus can be improved.

Further, in each of the exposure apparatuses of the present invention which are described in <7> and <7-1>, optical components placed closer to the light source compared to the synthetic silica glass component are classified into any one of striae grades 1 to 3 in an evaluation according to Japanese Optical Glass Industrial Standards (JOGIS) 11-1975. Accordingly, the energy density inhomogeneity of light, which becomes a cause of the generation of microchannels, is not generated by striae of the synthetic silica glass component when pulsed light passes through the synthetic silica glass component. Consequently, pulsed light containing energy density inhomogeneity is not applied to optical components placed closer to the exposure object than the synthetic silica glass component is. Thus, the generation of microchannels can be reduced, and the life of the exposure apparatus can be further improved.

Moreover, in each of the exposure apparatuses of the present invention which are described in <8> and <8-1>, the sizes of foreign substances and bubbles contained in optical components placed closer to the light source than the synthetic silica glass component are 1 μm or less. Accordingly, the energy density inhomogeneity of light, which becomes a cause of the generation of microchannels, is not generated when pulsed light passes. Thus, the generation of microchannels can be reduced, and the life of the exposure apparatus can be improved.

Further, in each of the exposure apparatuses of the present invention which are described in <9> and <9-1>, the energy density inhomogeneity of pulsed light is reduced to a predetermined range. Accordingly, there is no slight and greatly-varied energy density inhomogeneity which is prone to become a cause of the generation of microchannels. Thus, the generation of microchannels can be reduced, and the life of the exposure apparatus can be improved.

Further, in each of the exposure apparatuses of the present invention which are described in <10> and <10-1>, all the synthetic silica glass component is placed closer to the exposure object than the homogenizer placed closest to the light source is. Accordingly, ultraviolet light in which energy density inhomogeneity that becomes a cause of the generation of microchannels is reduced can be applied to the synthetic silica glass component. Thus, the generation of microchannels can be reduced, and the life of the exposure apparatus can be improved.

Further, in each of the optical components of the present invention which are described in <11> and <12>, the thickness of the synthetic silica glass component, and the pulse width and the energy density per pulse of the pulsed light applied to the synthetic silica glass component have a specific relationship. Accordingly, the generation of microchannels can be reduced, and a highly durable optical component for an exposure apparatus can be provided.

Further, in the exposure method of the present invention which is described in <13>, any one of the exposure apparatuses of the present invention in which the generation of microchannels is reduced is used. Accordingly, stable exposure characteristics can be maintained for a long period of time.

BEST MODES FOR CARRYING OUT THE INVENTION

Hereinafter, an embodiment of the present invention will be described.

Figure 1:
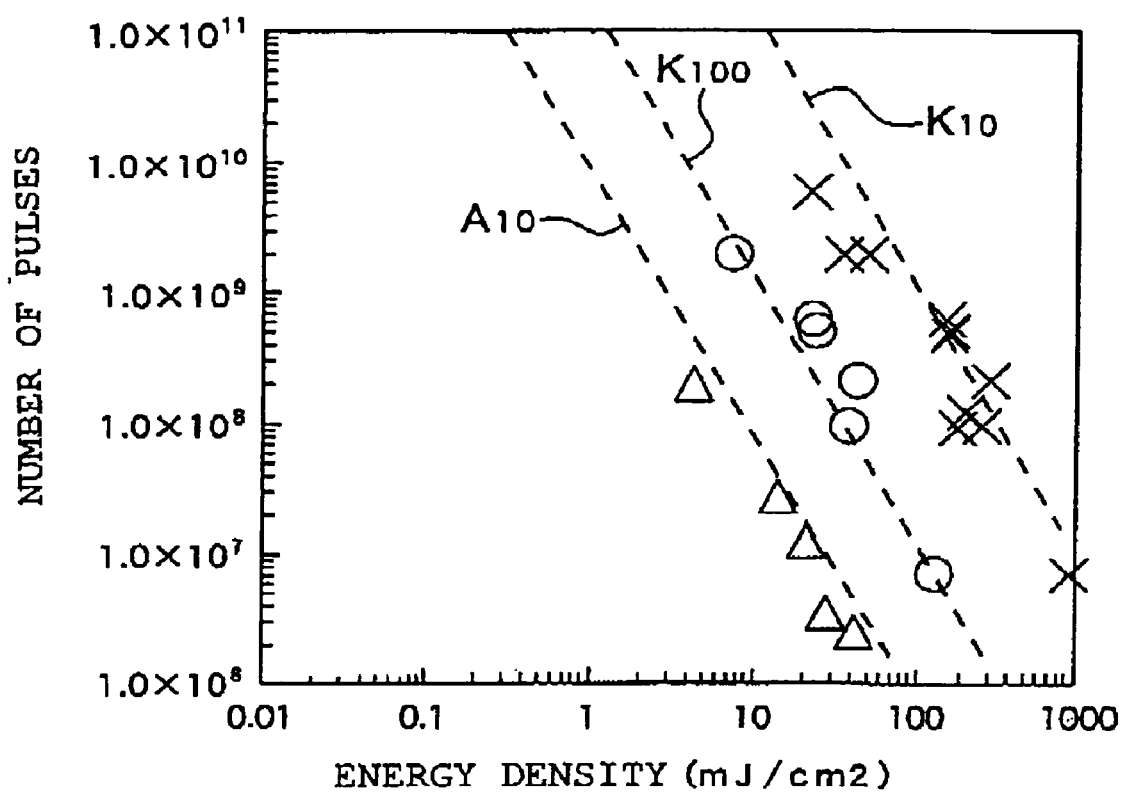
FIG. 1 is a graph showing the correlation between irradiation energy density and the number of pulses necessary for the generation of microchannels.
Figure 2:
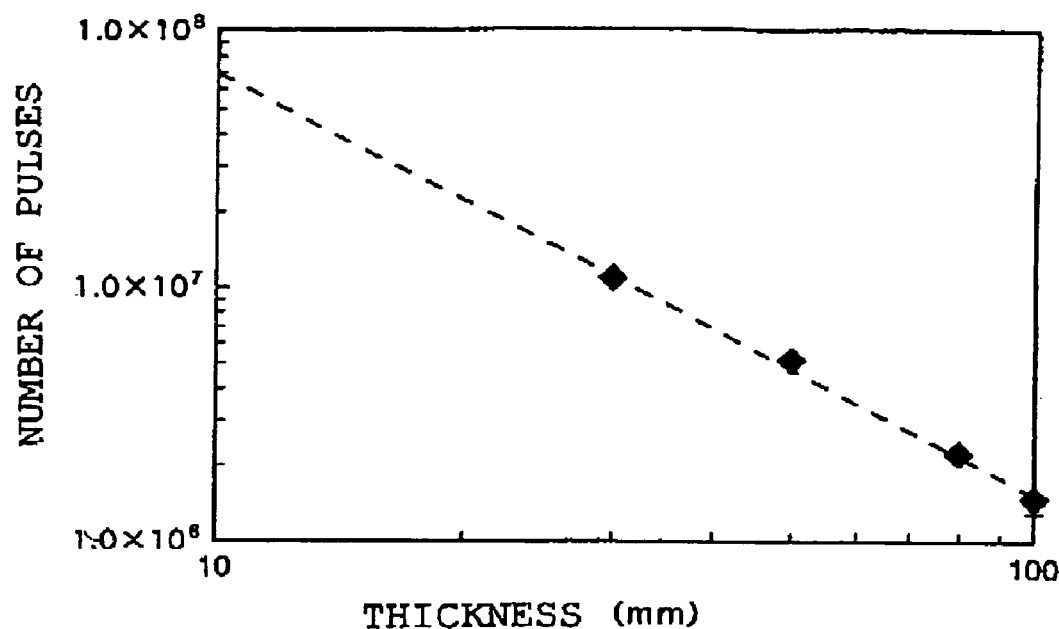
FIG. 2 is a graph showing the correlation between the thickness of an optical component and the number of pulses necessary for the generation of microchannels.
Figure 3:
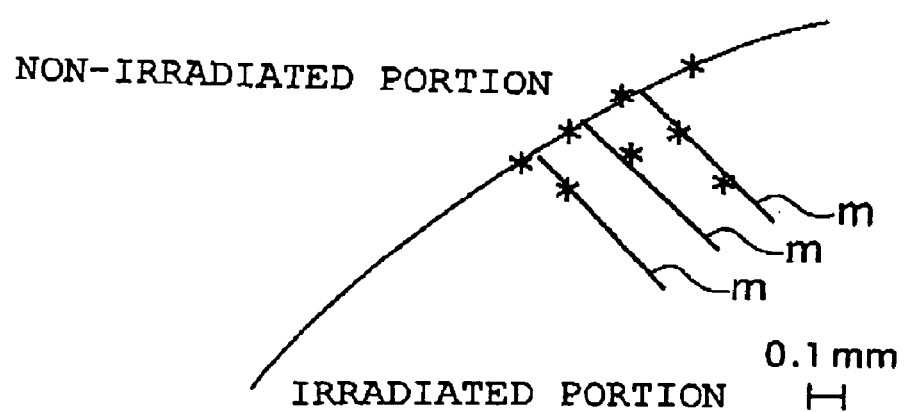
FIG. 3 is a schematic diagram of a differential interference contrast microscopy image of microchannels.
Figure 4:
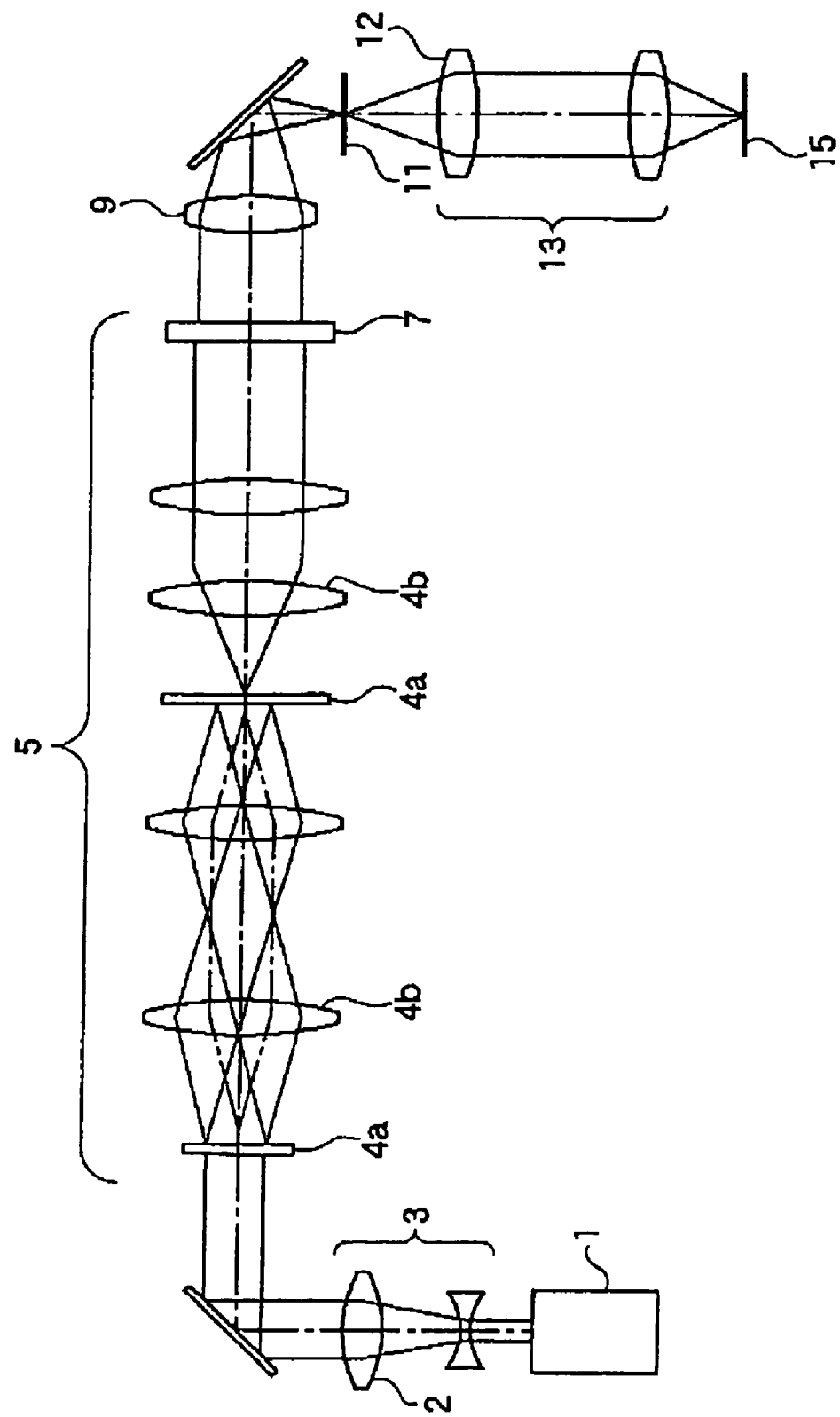
FIG. 4 is a diagram schematically showing the constitution of an exposure apparatus according to a favorable embodiment of the present invention.

FIG. 4 is an exposure apparatus according to a favorable embodiment of the present invention. This exposure apparatus is constituted so that ultraviolet light which has a wavelength of 300 nm or less and which is applied from a light source 1 is converted into a parallel beam in a beam-shaping optical system 3 having a plurality of lenses 2 placed therein, applied to a mask 11 through an integrator 7 such as a fly's-eye lens and a condenser lens 9 after the deviation and the like of the beam is corrected in a homogenizer 5 including a diffraction grating 4a and a lens 4b to reduce energy density inhomogeneity, and then passed through a projection optical system 13 including a large number of lenses 12; and that an exposure shape such as a circuit pattern of the mask 11 is transferred onto an exposure object 15 such as a wafer. At the time of this exposure, for example, pulsed light having a wavelength of 300 nm or less, such as KrF excimer laser light, or pulsed light having a wavelength of 200 nm or less, such as ArF excimer laser light, is applied from the light source 1. Note that the integrator 7 such as a fly's-eye lens acts as a homogenizer even by itself alone.

In this exposure apparatus, synthetic silica glass components formed from synthetic silica glass are used as some or all of a large number of optical components such as the lenses 2, 4b, 7, 9, and 12 and the diffraction grating 4a. In this embodiment, the generation of microchannels in such synthetic silica glass components is reduced.

First, it is preferable to form a synthetic silica glass component so that the thickness of the synthetic silica glass component, the energy density per pulse of pulsed light applied to the synthetic silica glass component, and the pulse width of the pulsed light satisfy the following expression (1). In particular, in an exposure apparatus which applies pulsed light having a wavelength of 200 nm or less, it is particularly preferable to form the synthetic silica glass component so that the relationship of the following expression (2) is satisfied.

$$\tau I^{-2} L^{-1.7} \geq 0.02 (\text{ns} \cdot \text{mJ}^{-2} \cdot \text{cm}^{2.3} \cdot \text{pulse}^2) \quad (1)$$

$$\tau I^{-2} L^{-1.7} \geq 250 (\text{ns} \cdot \text{mJ}^{-2} \cdot \text{cm}^{2.3} \cdot \text{pulse}^2) \quad (2)$$

(In expressions (1) and (2), L is the thickness (unit: cm) of the synthetic silica glass component, I is the energy density (unit: $\text{mJ} \cdot \text{cm}^{-2} \cdot \text{pulse}^{-1}$) per pulse of the pulsed light applied to the synthetic silica glass component, and $\tau$ is the pulse width (unit: ns) of the pulsed light.)

Here, the thickness of the synthetic silica glass component is the thickness measured along the optical axis of the synthetic silica glass component. In the case of a convex lens in which this thickness is inhomogeneous, the thickness is a center thickness. In the case of a concave lens, the thickness is the distance between the outer peripheral portions. Further, in the case of a meniscus lens, the thickness is a value obtained by measuring the distance between the center of the convex face and the outer peripheral portion of the concave face along the optical axis.

Incidentally, the present invention does not require that all synthetic silica glass components constituting the exposure apparatus satisfy the aforementioned relational expressions. In a component, such as a lens 2 directly behind the light source, into which light rays having an extremely high energy density enter, if an attempt to prevent microchannels is made by applying the aforementioned relational expressions, the thickness L of the component becomes extremely small and is practically difficult to realize that microchannels are prevented. Accordingly, in the case where such a component is constituted by a synthetic silica glass component, it is expected that microchannels are generated in a relatively early stage and that management by part replacement or the like becomes necessary. However, the proportion of relevant components to the entire optical system is very small. Accordingly, if other components satisfy any one of the aforementioned relational expressions, the effect of reducing microchannels in the entire exposure apparatus is not greatly impaired. It is preferable that the number of synthetic silica glass components satisfying the relationship of the aforementioned expression (1) is half or more of the total number of synthetic silica glass components constituting the exposure apparatus. In particular, in an exposure apparatus which applies pulsed light having a wavelength of 200 nm or less, it is preferable that the number of synthetic silica glass components satisfying the relationship of the aforementioned expression (2) is half or more thereof. Further, if a component into which light rays having a high energy density enter is formed of anhydrous silica glass doped with fluorine or a crystalline material as described below, such a problem does not occur.

It is considered that microchannels are generated by the accumulation of compaction. In the case where synthetic silica glass is used as the material of an optical component, the occurrence of compaction cannot be avoided. Accordingly, in a region in which the energy density of ultraviolet light is high, e.g., a region in which the energy density per pulse of pulsed light applied to an optical component is 1 mJ·cm$^{-2}$·pulse$^{-1}$ or more, it is also preferable that a material in which compaction is less prone to occur is used for the optical component. This is because the generation of microchannels can be reduced by selecting the material of the optical component.

Materials for an optical component placed in a region to which pulsed light having such an energy density is applied include anhydrous silica glass doped with fluorine and a crystalline material made of a single crystal.

As for the anhydrous silica glass doped with fluorine, it is preferable to use one in which the amount of a refractive index change measured at a wavelength of 633 nm is 3 ppm or less before and after the application of $1 \times 10^7$ pulses of an ArF excimer laser having an energy density of 30 mJ·cm$^{-2}$·pulse$^{-1}$ per pulse. Such anhydrous silica glass doped with fluorine can make it easy to reduce the microchannel phenomenon.

Moreover, it is possible to use, as a crystalline material, only one or a combination of two or more selected from the group consisting of a quartz single crystal, an aluminum oxide single crystal, a calcium fluoride single crystal, a magnesium fluoride single crystal, and the like. If such a crystalline material is used, the microchannel phenomenon can be more reliably reduced.

Incidentally, it is also possible to use a crystalline material in a region in which the energy density per pulse is very high, e.g., a region to which pulsed light of approximately 10 to 100 mJ·cm$^{-2}$·pulse$^{-1}$ is applied, and to use a lens material such as anhydrous silica glass doped with fluorine having a small amount of compaction in a region of approximately 1 to 10 mJ·cm$^{-2}$·pulse$^{-1}$.

Next, in such an optical component, particularly in a synthetic silica glass component, in the case where applied light has a fine distribution of the energy density and where inhomogeneity exists in the energy density, microchannels are prone to be generated. Accordingly, in an exposure apparatus in which a plurality of optical components are placed, it is preferable to reduce the energy density inhomogeneity of light applied to the optical components in directions perpendicular to the optical axis.

It is speculated that this is because of the following: if light has energy density inhomogeneity, fine inhomogeneity in the refractive index is caused by the difference in compaction between fine portions; the fine inhomogeneity in the refractive index makes it easy to collect light at a large number of fine positions; and, as a result, microchannels become prone to be generated compared to those for the case of light having a homogeneous energy density.

Accordingly, in this exposure apparatus, first, it is preferable that, in ultraviolet light applied to optical components in which the generation of microchannels should be prevented, the width between top portions of energy density inhomogeneity is widen to more than 0.1 mm and the difference between a top portion and a bottom portion is 5% or less of an average energy density. It is particularly favorable that the width between top portions of energy density inhomogeneity is 1 mm or more.

Moreover, in the case where ultraviolet light emitted from the light source 1 has energy density inhomogeneity exceeding the above-described range, it is preferable to reduce the energy density inhomogeneity by placing the homogenizer 5. In particular, in this case, it is preferable that no synthetic silica glass component is placed in the space between the light source 1 and the homogenizer 5 placed closest to the light source 1, e.g., in the pencil-shaping optical system 3.

Furthermore, even if the energy density inhomogeneity of ultraviolet light applied from the light source 1 and that of ultraviolet light applied through the homogenizer 5 and the like are small, in the case where striae exist or foreign substances or bubbles having sizes of 1 μm or more exist when the ultraviolet light passes through each optical component, energy density inhomogeneity is generated in light which has passed through the optical component. Accordingly, in each optical component, particularly in an optical component placed closer to the light source compared to synthetic silica glass components, it is also preferable to adopt one which is less prone to generate energy density inhomogeneity.

It is preferable to use, as the optical component which is less prone to generate energy density inhomogeneity, an optical component classified into any one of striae grades 1 to 3 according to Japanese optical Glass Industrial Standards (JOGIS) 11-1975. Further, it is also preferable that the sizes of foreign substances and bubbles contained in the optical component are 1 μm or less. Here, striae grade 3 in Japanese Optical Glass Industrial Standards (JOGIS) 11-1975 means that slight layered inhomogeneity is observed by visual inspection in a projected image of pinhole light between both parallel 50 mm by 20 mm faces of a 50 mm by 50 mm by 20 mm optical component.

Incidentally, the present invention can be applied not only to a scanning projection aligner (U.S. Pat. No. 5,473,410) of a step-and-scan type which exposes a pattern of a reticle to light by synchronously moving the reticle and a wafer, i.e., a so-called scanning stepper, but also to a step-and-repeat exposure apparatus (stepper) in which a pattern of a reticle is exposed to light in the state where the reticle and a wafer remain at rest and in which wafers are sequentially moved step by step.

Further, the present invention can also be applied to a twin stage-type exposure apparatus. The structure and exposure operation of a twin stage-type exposure apparatus are disclosed in, for example, Japanese Patent Application Laid-Open Gazette Nos. Hei 10-163099 and Hei 10-214783 (corresponding U.S. Pat. Nos. 6,341,007, 6,400,441, 6,549,269, and 6,590,634), International Application National-Phase Publication No. 2000-505958 (corresponding U.S. Pat. No. 5,969,441), and U.S. Pat. No. 6,208,407.

Furthermore, the present invention can also be applied to: an immersion exposure apparatus in which the space between a projection optical system and an exposure object is locally filled with liquid; an immersion exposure apparatus in which a stage holding a substrate to be exposed to light is moved in a cistern; and an immersion exposure apparatus in which a cistern having a predetermined depth is formed on a stage and in which a substrate is held therein. The structure and exposure operation of an immersion exposure apparatus in which a stage holding a substrate to be exposed to light is moved in a cistern are disclosed in, for example, Japanese Patent Application Laid-Open Gazette No. Hei 6-124873; and those of an immersion exposure apparatus in which a cistern having a predetermined depth is formed on a stage and in which a substrate is held therein are disclosed in, for example, Japanese Patent Application Laid-Open Gazette No. Hei 10-303114 and U.S. Pat. No. 5,825,043.

As described above, an exposure apparatus of the present invention only needs to have the constitution described in any one of the aforementioned <1> to <10>, <7-1>, <8-1>, <9-1>, and <10-1>. Other constitutions are not particularly limited. The above-described U.S. Pat. Nos. 5,473,410, 6,341,007, 6,400,441, 6,549,269, 6,590,634, 5,969,441, 6,208,407, and 5,825,043, Japanese Patent Application Laid-Open Gazette Nos. Hei 10-163099, Hei 10-214783, Hei 6-124873, and Hei 10-303114, and International Application National-Phase Publication No. 2000-505958, in which constitutions capable of being applied to an exposure apparatus of the present invention are described, are incorporated as references in this specification.

EXAMPLES

Hereinafter, the present invention will be more specifically described based on examples. However, the present invention is not limited to the following examples.

Example 1

Samples were made by preparing anhydrous silica glass doped with fluorine containing 10000 ppm fluorine, quartz of grade Aa (having a Q value of $380 \times 10^4$ or more) in JIS-C6704, and a calcium fluoride single crystal having a transmittance of 92.1% or more at 193 nm including multiple reflection, cutting them to a size having a diameter of 30 mm and a thickness of 10 mm, and optically polishing both faces having diameters of 30 mm. Incidentally, in the anhydrous silica glass doped with fluorine, the amount of a refractive index change measured at a wavelength of 633 nm was 3 ppm or less after the application of $1 \times 10^7$ pulses of ArF excimer laser light having an energy density of 30 $mJ \cdot cm^{-2} \cdot pulse^{-1}$.

KrF excimer laser light or ArF excimer laser light which is limited by an aperture and which has a diameter of 5 mm was directly applied to each sample from a light source without being passed through an optical component such as a lens or a homogenizer. The energy density per pulse of the laser light was adjusted by changing the discharge voltage, and the value was measured by placing a Joule meter at the position of the sample. The sample was placed inside a box made of aluminum, and the atmosphere in the box was replaced with dry nitrogen gas. The energy density of the laser beam was fixed, and the laser beam was applied until microchannels were generated. The time width $\tau$ of each pulse of the excimer laser is 20 ns in both the cases of KrF and ArF excimer lasers. The presence or absence of microchannels was confirmed by visual inspection by irradiating the sample with the light of a condenser lamp.

As a result, it was confirmed that in the anhydrous silica glass (OH<100 ppm) doped with fluorine, the amount of compaction is small and that resistance to ArF excimer laser light is approximately 10 times as high as that of synthetic silica glass.

Further, in the quartz single crystal and the calcium fluoride single crystal, no microchannels were generated even after the application of ArF excimer laser light of pulses which are 100 times or more as many as those for the case of the synthetic silica glass.

Example 2

A sample was made by cutting synthetic silica glass containing 1100 ppm OH groups and $2 \times 10^{12}$ hydrogen molecules/$cm^3$ to a size having a diameter of 30 mm and a thickness of 10 mm and optically polishing both faces having diameters of 30 mm. KrF or ArF excimer laser light passed through a homogenizer was limited to a diameter of 5 mm by an aperture to be applied to this sample. Then, the generation of microchannels was observed in the same procedure as that of Example 1.

When laser light from a light source was observed through the homogenizer, no energy density inhomogeneity was seen in both laser lights. Further, in the synthetic silica glass irradiated with a beam passed through the homogenizer, no microchannels were generated even after the application of pulses which are approximately 100 times or more as many as those for the case of application without a homogenizer.

Example 3

A sample was made by cutting synthetic silica glass containing 1100 ppm OH groups and $2 \times 10^{12}$ hydrogen molecules/$cm^3$ to a size having a diameter of 30 mm and a thickness of 10 mm and optically polishing both faces having diameters of 30 mm. Each of synthetic silica glass components classified into striae grades 1 to 4 according to JOGIS-11-1975 was placed between this sample and a light source, and the same irradiation as that of Example 1 was performed, thus comparing the number of pulses necessary for the generation of microchannels.

As a result, in the case where the synthetic silica glass of striae grade 1 or 2 was placed, the number of pulses at the time of the generation of microchannels was the same. On the other hand, in the case where the synthetic silica glass of striae grade 3 was placed, the number of pulses at the time of the generation of microchannels was reduced to one tenth of those of the above-described two cases but sufficiently increased compared to that of striae grade 4.

Example 4

Using a sample made as in Example 3, a comparison was made between the case where synthetic silica glass not containing bubbles and foreign substances was placed between the sample and an aperture and the case where synthetic silica glass having foreign substances or bubbles having sizes of approximately 1 μm contained therein was placed therebetween. Irradiation conditions were the same as those of Example 1.

As a result, in the case where the synthetic silica glass having foreign substances or bubbles contained therein was placed, the number of pulses at the time of the generation of microchannels was reduced to one twentieth of that for the case where the synthetic silica glass not containing bubbles and foreign substances was placed.

Example 5

Figure 5:
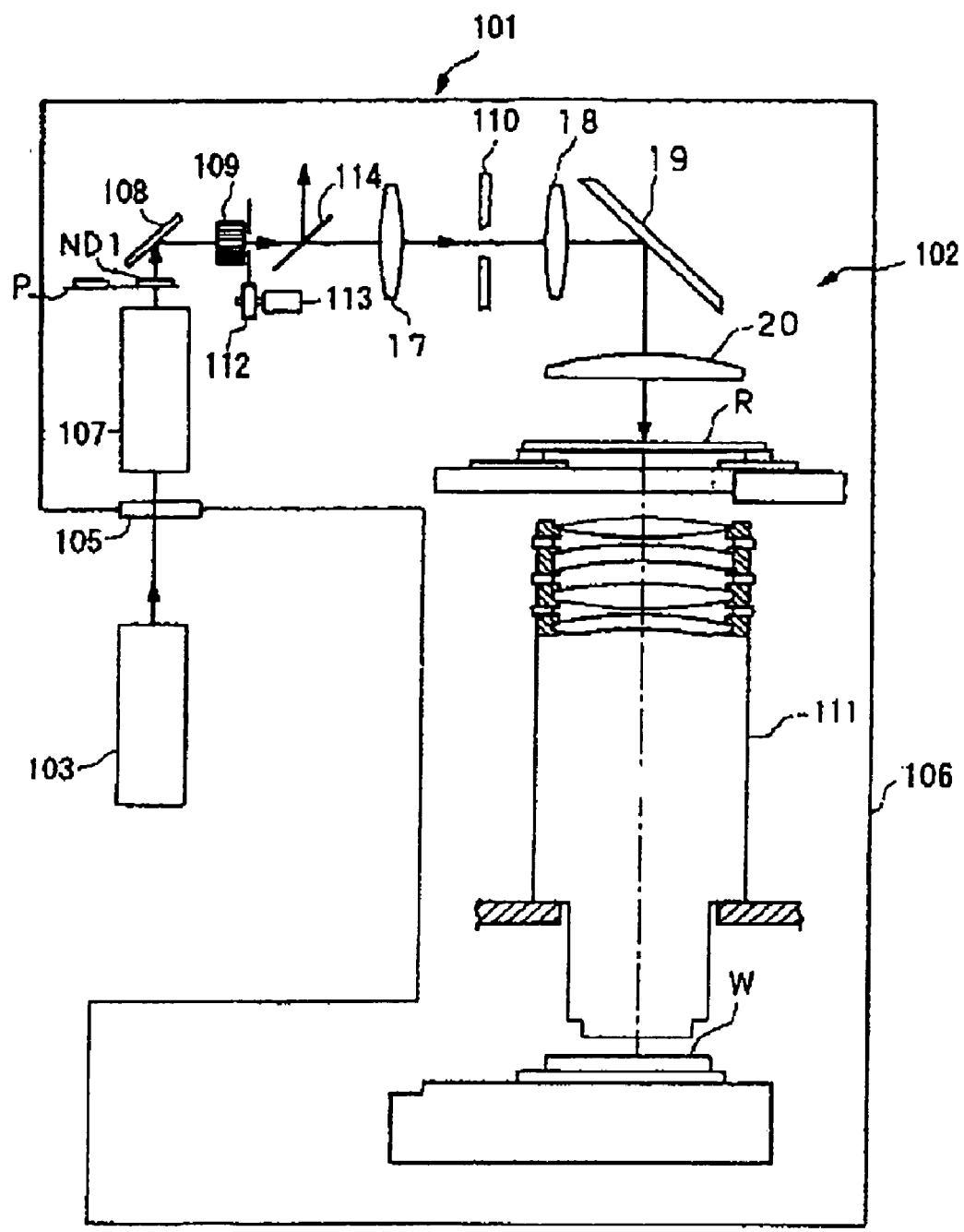
FIG. 5 is a diagram schematically showing the constitution of an exposure apparatus according to another favorable embodiment of the present invention.

An exposure apparatus of the present invention which is shown in FIG. 5 was fabricated, and an irradiation experiment described below was performed. FIG. 5 is a schematic diagram of the constitution of the exposure apparatus 101 fabricated in this example.

Laser light (exposure light) as an approximately parallel beam is emitted from a KrF excimer laser light source 103 which oscillates pulsed light having an output wavelength of 248 nm and a pulse width of 20 ns, and is led to an optically transparent window 105 of an exposure apparatus body 102.

Here, the exposure apparatus body 102 is contained in a chamber 106 and controlled so that the temperature thereof is maintained constant. Laser light passed through the optically transparent window 105 is shaped into laser light having a predetermined cross-sectional shape by a beam-shaping optical system 107, passed through one (ND1 in FIG. 5) of a plurality of ND filters which have different transmittances (extinction factors) and which are provided on a turret plate (TP), reflected by a reflecting mirror 108, and led to a fly's-eye lens 109 as a homogenizer (integrator). The fly's-eye lens 109 is constituted by bundling a large number of lens elements. A large number of light source images (secondary light sources) corresponding to the number of lens elements constituting it are formed on exit surfaces of these lens elements.

At the position of a large number of secondary light sources formed by the fly's-eye lens 109, a turret plate 112 having a plurality of aperture stops having different shapes and different sizes is placed. The turret plate 112 is rotated by a motor 113, and one aperture stop is selected and inserted into the light path of an illuminating optical system depending on a pattern of a reticle R which is to be transferred onto a wafer W. The turret plate 112 and the motor 113 constitute a variable aperture stop for the illuminating system.

The beam from the secondary light sources formed by the fly's-eye lens 109 pass through the variable aperture stop of the turret plate 112 to be split into two light paths by a beam splitter 114. Light passed through the beam splitter 114 is passed through a relay lens 17, a variable field stop 110 which defines a rectangular opening, and a relay lens 18, reflected by a reflecting mirror 19, and then collected in a condenser optical system 20 including a plurality of refractive optical elements such as lenses. Thus, an illuminated region on the reticle R which is defined by the opening of the variable field stop 110 is evenly illuminated in a superimposed manner. Further, an image of a circuit pattern on the reticle R is formed on the wafer W, which is an exposure object, by a projection optical system 111, and resist applied to the top of the wafer W is exposed to light, whereby a circuit pattern image is transferred onto the wafer W.

In the exposure apparatus 101 of this example, a plurality of optical components are placed in the illuminating optical system and the projection optical system, and include at least one synthetic silica glass.

Among the optical components constituting the exposure apparatus 101 of this example, the relay lens 18 is made of synthetic silica glass, and designed so that the center thickness L is 5 cm and that the incident energy density I is 6 mJ·cm$^{-2}$·pulse$^{-1}$. Accordingly, for the relay lens 18, the following expression is satisfied:

$$\tau I^{-2} L^{-1.7} = 0.036 \geq 0.02$$

That is, the relay lens 18 is constituted so that the aforementioned expression (1) is satisfied. In the exposure apparatus 101 of this example, even when 10$^{10}$ pulses or more of KrF laser light was applied, no microchannels were generated in the relay lens 18, and stable exposure performance was maintained.

Incidentally, in this example, the incident energy density I in the relay lens 18 is a value for the case where among the ND filters on the turret plate TP, one having a highest transmittance is selected. If an ND filter having a transmittance lower than this is selected, the incident energy density I in the relay lens 18 also decreases. Accordingly, the above-described condition is still satisfied whichever ND filter is selected.

Further, in the exposure apparatus 101 of this example, each of the beam-shaping optical system 107, the ND filters on the turret plate TP, and the reflecting mirror 108, which are placed between the KrF excimer laser light source 103 and the fly's-eye lens 109, is constituted by a component (calcium fluoride single crystal or the like) other than synthetic silica glass. Accordingly, the exposure apparatus 101 of this example is constituted so that all synthetic silica glass components are placed closer to the wafer W (exposure object) than the fly's-eye lens 109, which is a homogenizer and which is closest to the KrF excimer laser light source 103. The energy density of light applied to the synthetic silica glass components was sufficiently made homogeneous by the homogenizer.

Furthermore, all optical components constituting the exposure apparatus 101 of this example are classified into striae grade 1 in an evaluation according to JOGIS 11-1475, and are made of a material not containing foreign substances and bubbles exceeding 1 μm. The occurrence of the energy density inhomogeneity of light passing through the optical components was sufficiently reduced.

With the above-described constitution, in light entering the synthetic silica glass components in the exposure apparatus 101 of this example, the width between adjacent top portions of energy density inhomogeneity in a plane perpendicular to the optical axis was larger than 0.1 mm, and the difference between a top portion and a bottom portion of the energy density was limited to 5% or less of an average energy density. Accordingly, it was confirmed that the generation of microchannels resulting from energy density inhomogeneity is sufficiently reduced in the synthetic silica glass components constituting the exposure apparatus 101 of this example, and that exposure performance stable for a long period of time is maintained in the exposure apparatus 101 of this example.

Incidentally, instead of the wafer W in this example, a glass plate for a liquid crystal display device, a ceramic wafer for a thin-film magnetic head, a mask or a reticle master (synthetic silica, silicon wafer) used in an exposure apparatus, or the like can also be adopted. The application of the exposure apparatus 101 is not limited to an exposure apparatus for semiconductor manufacture. The exposure apparatus 101 can also be widely applied to, for example, an exposure apparatus for liquid in which a liquid crystal display element pattern is transferred onto a rectangular glass plate, an exposure apparatus for manufacturing a thin-film magnetic head, an image sensing device (CCD), a reticle R, or the like.

INDUSTRIAL APPLICABILITY

As described above, with the exposure apparatus of the present invention, the generation of microchannels in optical components at the time of ultraviolet light (pulsed light) irradiation is sufficiently reduced, and mechanical damage of optical components at the time of exposing an exposure object to light can be prevented to improve the life of the exposure apparatus.

Further, with the synthetic silica glass component of the present invention, the generation of microchannels at the time of ultraviolet light (pulsed light) irradiation is sufficiently reduced, and the life of an exposure apparatus using the component can be improved.

Furthermore, with the exposure method of the present invention, the generation of microchannels in an optical component can be sufficiently reduced to maintain stable exposure characteristics for a long period of time.

The invention claimed is:

1. An exposure apparatus which comprises a light source emitting pulsed light having a wavelength of 300 nm or less and which exposes an exposure object to light by applying the pulsed light passed through a plurality of optical components, wherein at least one of the plurality of optical components is a synthetic silica glass component; and a thickness of the synthetic silica glass component, an energy density per pulse of pulsed light applied to the synthetic silica glass component, and a pulse width of the pulsed light satisfy the following expression (1):

$$\tau I^{-2} L^{-1.7} \geq 0.002 (\text{ns} \cdot \text{mJ}^{-2} \cdot \text{cm}^{2.3} \cdot \text{pulse}^2) \quad (1)$$

wherein L is the thickness (unit: cm) of the synthetic silica glass component, I is the energy density (unit: $\text{mJ} \cdot \text{cm}^{-2} \cdot \text{pulse}^{-1}$) per pulse of the pulsed light applied to the synthetic silica glass component, and $\tau$ is the pulse width (unit: ns) of the pulsed light.

2. The exposure apparatus according to claim 1, wherein the wavelength of the pulsed light is 200 nm or less; and the thickness of the synthetic silica glass component, the energy density per pulse of the pulsed light applied to the synthetic silica glass component, and the pulse width of the pulsed light satisfy the following expression (2):

$$\tau I^{-2} L^{-1.7} \geq 25 (\text{ns} \cdot \text{mJ}^{-2} \cdot \text{cm}^{2.3} \cdot \text{pulse}^2) \quad (2)$$

wherein L is the thickness (unit: cm) of the synthetic silica glass component, I is the energy density (unit: $\text{mJ} \cdot \text{cm}^{-2} \cdot \text{pulse}^{-1}$) per pulse of the pulsed light applied to the synthetic silica glass component, and $\tau$ is the pulse width (unit: ns) of the pulsed light.

3. The exposure apparatus according to claim 1, wherein the number of synthetic silica glass components satisfying expression (1) is half or more of the total number of synthetic silica glass components among the plurality of optical components.

4. The exposure apparatus according to claim 2, wherein the number of synthetic silica glass components satisfying expression (2) is half or more of the total number of synthetic silica glass components among the plurality of optical components.

5. The exposure apparatus according to claim 1, wherein the light source emits pulsed ultraviolet light having a wavelength of 300 nm or less, at least one of the plurality of optical components is a synthetic silica glass component, and optical components placed closer to the light source compared to the synthetic silica glass component are classified into any one of striae grades 1 to 3 in an evaluation according to Japanese Optical Glass Industrial Standards (JOGIS) 11-1975.

6. The exposure apparatus according to claim 1, wherein the light source emits pulsed ultraviolet light having a wavelength of 300 nm or less, at least one of the plurality of optical components is a synthetic silica glass component, and sizes of foreign substances and bubbles contained in optical components placed closer to the light source compared to the synthetic silica glass component are 1 µm or less.

7. The exposure apparatus according to claim 1, wherein the light source emits pulsed ultraviolet light having a wavelength of 300 nm or less; at least one of the plurality of optical components is a synthetic silica glass component; and, in ultraviolet light applied to the synthetic silica glass component, a width between adjacent top portions of energy density inhomogeneity in a plane perpendicular to an optical axis is larger than 0.1 mm, and a difference between a top portion and a bottom portion of the energy density is 5% or less of an average energy density.

8. The exposure apparatus according to claim 1, further comprising: a homogenizer reducing energy density inhomogeneity of the ultraviolet light in a plane perpendicular to an optical axis, wherein the light source emits pulsed ultraviolet light having a wavelength of 300 nm or less, at least one of the plurality of optical components is a synthetic silica glass component, and all the synthetic silica glass component is placed closer to the exposure object than the homogenizer placed closest to the light source is.

9. A synthetic silica glass component for exposure apparatus used in an optical system of an exposure apparatus which exposes an exposure object to pulsed light having a wavelength of 300 nm or less, wherein a thickness of the synthetic silica glass component, an energy density per pulse of the pulsed light applied to the synthetic silica glass component, and a pulse width of the pulsed light satisfy the following expression (3):

$$\tau I^{-2} L^{-1.7} \geq 0.02 (ns \cdot mJ^{-2} \cdot cm^{2.3} \cdot pulse^2) \quad (3)$$

wherein L is the thickness (unit: cm) of the synthetic silica glass component, I is the energy density (unit: $\text{mJ} \cdot \text{cm}^{-2} \cdot \text{pulse}^{-1}$) per pulse of the pulsed light applied to the synthetic silica glass component, and $\tau$ is the pulse width (unit: ns) of the pulsed light.

10. The synthetic silica glass component for exposure apparatus according to claim 9, wherein the wavelength of the pulsed light is 200 nm or less; and the thickness of the synthetic silica glass component, the energy density per pulse of the pulsed light applied to the synthetic silica glass component, and the pulse width of the pulsed light satisfy the following expression (4):

$$\tau I^{-2} L^{-1.7} \geq 25 (\text{ns} \cdot \text{mJ}^{-2} \cdot \text{cm}^{2.3} \cdot \text{pulse}^2) \quad (4)$$

wherein L is the thickness (unit: cm) of the synthetic silica glass component, I is the energy density (unit: $\text{mJ} \cdot \text{cm}^{-2} \cdot \text{pulse}^{-1}$) per pulse of the pulsed light applied to the synthetic silica glass component, and $\tau$ is the pulse width (unit: ns) of the pulsed light.

11. A method of exposing an image of a pattern provided on a master to light and projecting the image onto a substrate having a photosensitive material, wherein the exposure apparatus according to claim 1 is used.

* * * * *